United States Patent
Nakada et al.

(10) Patent No.: US 11,127,894 B2
(45) Date of Patent: Sep. 21, 2021

(54) SPIN-ORBIT-TORQUE MAGNETIZATION ROTATING ELEMENT, SPIN-ORBIT-TORQUE MAGNETORESISTANCE EFFECT ELEMENT, AND MAGNETIC MEMORY

(71) Applicant: TDK CORPORATION, Tokyo (JP)

(72) Inventors: Katsuyuki Nakada, Tokyo (JP); Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 109 days.

(21) Appl. No.: 16/349,537

(22) PCT Filed: Oct. 30, 2018

(86) PCT No.: PCT/JP2018/040221
§ 371 (c)(1),
(2) Date: May 13, 2019

(87) PCT Pub. No.: WO2019/163203
PCT Pub. Date: Aug. 29, 2019

(65) Prior Publication Data
US 2020/0266336 A1 Aug. 20, 2020

(30) Foreign Application Priority Data
Feb. 22, 2018 (JP) .............................. JP2018-029737

(51) Int. Cl.
*H01L 43/02* (2006.01)
*H01L 27/22* (2006.01)

(52) U.S. Cl.
CPC ............ *H01L 43/02* (2013.01); *H01L 27/222* (2013.01)

(58) Field of Classification Search
CPC ........ H01L 43/02; H01L 27/222; H01L 43/08
See application file for complete search history.

(56) References Cited

U.S. PATENT DOCUMENTS

| 8,350,347 B2 | 1/2013 | Gaudin et al. |
| 2006/0044703 A1* | 3/2006 | Inomata ............... G11B 5/7325 360/324.1 |
| 2015/0348606 A1 | 12/2015 | Buhrman et al. |
| 2017/0077394 A1 | 3/2017 | Saida |
| 2017/0207016 A1 | 7/2017 | Butler et al. |
| 2017/0222135 A1 | 8/2017 | Fukami et al. |

(Continued)

FOREIGN PATENT DOCUMENTS

| JP | 2017-059690 A | 3/2017 |
| WO | 2011/122078 A1 | 10/2011 |

(Continued)

OTHER PUBLICATIONS

Y. K. Kato et al., "Observation of the Spin Hall Effect in Semiconductors"; Science; vol. 306; 2004; pp. 1910-1913.

(Continued)

*Primary Examiner* — Matthew L Reames
(74) *Attorney, Agent, or Firm* — Oliff PLC (57) ABSTRACT

This spin-orbit-torque magnetization rotating element includes a spin-orbit torque wiring extending in a first direction and a first ferromagnetic layer laminated on the spin-orbit torque wiring, wherein the spin-orbit torque wiring includes a compound represented by XYZ or $X_2YZ$ with respect to a stoichiometric composition.

21 Claims, 4 Drawing Sheets

(56) References Cited

U.S. PATENT DOCUMENTS

| | | |
|---|---|---|
| 2018/0351085 A1 | 12/2018 | Shiokawa et al. |
| 2019/0035446 A1 | 1/2019 | Shibata |
| 2019/0251427 A1* | 8/2019 | Park .................. G06N 3/04 |

FOREIGN PATENT DOCUMENTS

| | | |
|---|---|---|
| WO | 2016/021468 A1 | 2/2016 |
| WO | 2017/090730 A1 | 6/2017 |
| WO | 2017/213261 A1 | 12/2017 |

OTHER PUBLICATIONS

I. M. Miron et al., "Perpendicular switching of a single ferromagnetic layer induced by in-plane current inection"; Nature; vol. 476; Aug. 11, 2011; pp. 189-193.

L. Liu et al., "Title: Spin torque switching with the giant spin Hall effect of tantalum"; Science; 336; 555; 2012; pp. 1-19 and 1-12.

L. Liu et al., "Current-Induced Switching of Perpendicularly Magnetized Magnetic Layers Using Spin Torque from the Spin Hall Effect"; Physical Review Letters; 109; 2012; pp. 096602-1-096602-5.

KS. Lee et al., "Title: Threshold current for switching of a perpendicular magnetic layer induced by spin Hall effect"; Applied Physics Letters; 102; 112410; 2013; pp. 1-17.

KS. Lee et al., "Thermally activated switching of perpendicular magnet by spin-orbit spin torque"; Applied Physics Letters; vol. 104; 2014; pp. 072413-1-072413-5.

S. Fukami et al., "Magnetization switching by spin-orbit torque in an antiferromagnet-ferromagnet bilayer system"; nature materials; vol. 15; 2016; pp. 535-541.

S. Fukami et al., "A spin-orbit torque switching scheme with collinear magnetic easy axis and current confirguration"; nature nanotechnology; 11; 621; Mar. 21, 2016; pp. 1-6.

S. Takahashi et al., "Spin injection and detection in magnetic nanostructures"; Physical Review B 67; 2003; pp. 052409-1-052409-4.

Y. Seo et al., "Area-Efficient SOT-MRAM With a Schottky Diode"; IEEE Electron Device Letters; vol. 37; No. 8; Aug. 2016; pp. 982-985.

W. Zhang et al., "Spin Hall Effects in Metallic Antiferromagents"; Physical Review Letters; 113; 2014; pp. 196602-1-196602-6.

Hiroshi Mabuchi, "Development of Al—Ti—X ternary system LI2 type intermetallic compound," Bulletin of the Japan Institute of Metals, vol. 30, No. 1, 1991, pp. 24 to 30.

Translation of Apr. 7, 2020 Office Action issued in Japanese Patent Application No. 2019-096629.

Tsuchiya, "Heat Treatment Temperature Dependence of Exchange Magnetic Anisotropy in Mn2VAl/Fe Layered Films of Stoichiometric Composition", Proceedings of the 2016 (159th) Autumn Meeting, the Japan Institute Metals and Materials, Sep. 7, 2016, p. 378.

Tsuchiya, Exchange Magnetic Permeability in Ni2MnAl/X (X: Fe, Co, Co2MnSi) Layered Films, Proceedings of the 2015 (157th) Autumn Meeting of the Japan Institute Metals and Materials, Sep. 2, 2015, p. S4.21.

Sep. 9, 2020 Translation of Office Action in Japanese Patent Application No. 2019-096629.

Tsuchiya, "Heat Treatment Temperature Dependence of Exchange Magnetic Anisotropy in Mn2VAl/Fe Layered Films of Stoichiometric Composition", Proceedings of the 2016 (159th) Autumn Meeting, the Japan Institute Metals and Materials, Sep. 7, 2016, p. 378.

Sep. 8, 2020 Translation of Office Action in Japanese Patent Application No. 2019-096629.

* cited by examiner

SPIN-ORBIT-TORQUE MAGNETIZATION ROTATING ELEMENT, SPIN-ORBIT-TORQUE MAGNETORESISTANCE EFFECT ELEMENT, AND MAGNETIC MEMORY

TECHNICAL FIELD

The present invention relates to a spin-orbit-torque magnetization rotating element, a spin-orbit-torque magnetoresistance effect element, and a magnetic memory.

Priority is claimed on Japanese Patent Application No. 2018-029737, filed Feb. 22, 2018, the content of which is incorporated herein by reference.

BACKGROUND ART

Giant magnetoresistance (GMR) elements formed of a multilayer film constituted of a ferromagnetic layer and a non-magnetic layer and tunneling magnetoresistance (TMR) elements using an insulating layer (a tunnel barrier layer or a barrier layer) for a non-magnetic layer are known as magnetoresistance effect elements. Generally, TMR elements have a higher element resistance and a higher magnetoresistive (MR) ratio than GMR elements. For this reason, TMR elements are attracting attention as magnetic sensors, high frequency components, magnetic heads, and elements for nonvolatile random access memories (MRAMs).

An MRAM reads and writes data using the characteristics in which an element resistance of a TMR element changes when a direction of the magnetization of two ferromagnetic layers sandwiching an insulating layer changes. As a writing method of an MRAM, a method in which writing (magnetization reversal) is performed using a magnetic field generated by a current or a method in which writing (magnetization reversal) is performed using a spin transfer torque (STT) generated by causing a current to flow in a lamination direction of a magnetoresistance effect element are known.

Although the magnetization reversal of a TMR element using an STT is efficient in view of energy efficiency, it is necessary to cause a current to flow in a lamination direction of a magnetoresistance effect element when writing data. A write current deteriorates the characteristics of a magnetoresistance effect element in some cases.

Thus, in recent years, attention has been paid to a magnetization reversal using a spin current generated by spin-orbit interaction which performs the magnetization reversal through a mechanism different from an STT (for example, Non-Patent Literature 1). A spin-orbit torque (SOT) is induced by a spin current caused by spin-orbit interaction or a Rashba effect at an interface between dissimilar materials. A current for inducing an SOT in a magnetoresistance effect element is caused to flow in a direction intersecting a lamination direction of the magnetoresistance effect element. That is to say, it is not necessary to cause a current to flow in the lamination direction of the magnetoresistance effect element and it is expected that such a magnetoresistance effect element would have a long lifespan.

CITATION LIST

Non-Patent Literature

[Non-Patent Literature 1]
S. Fukami, T. Anekawa, C. Zhang, and H. Ohno, Nature Nano Tech (2016).

SUMMARY OF INVENTION

Technical Problem

However, it can be said that a reversal current density due to an SOT in a current element structure is substantially the same as a reversal current density due to an STT. Although a flow of a current which generates a spin current does not damage the magnetoresistance effect element, reduction of the reversal current density is required in view of driving efficiency. In order to reduce the reversal current density, it is necessary to generate a spin current more efficiently.

The present invention was made in view of the above-described circumstances and an objective of the present invention is to provide a spin-orbit-torque magnetization rotating element, a spin-orbit-torque magnetoresistance effect element, and a magnetic memory capable of efficiently generating a spin current.

Solution to Problem

In order to accomplish the above-described objective, the present invention provides the following means.

(1) A spin-orbit-torque magnetization rotating element according to a first aspect includes: a spin-orbit torque wiring extending in a first direction; and a first ferromagnetic layer laminated on the spin-orbit torque wiring, wherein the spin-orbit torque wiring includes a compound represented by XYZ or $X_2YZ$ with respect to a stoichiometric composition, and a main framework of the spin-orbit torque wiring has a structure including any of an $L2_1$ structure, a B2 structure, and an A2 structure in a case where the compound is represented by $X_2YZ$ and has a structure including any of a $C1_b$ structure, the B2 structure, and the A2 structure in a case where the compound is represented by XYZ.

(2) A spin-orbit-torque magnetization rotating element according to a second aspect includes: a spin-orbit torque wiring extending in a first direction; and a first ferromagnetic layer laminated on the spin-orbit torque wiring, wherein the spin-orbit torque wiring includes a compound represented by XYZ or $X_2YZ$ with respect to a stoichiometric composition, X is at least one element selected from a group consisting of Fe, Co, Ni, Mn, Re, Ru, Os, Rh, Pd, Ir, and Pt, Y is at least one element different from the X and selected from a group consisting of Ti, V, Cr, Mo, W, Ta, Mn, Re, Os, Zr, Nb, Hf, Ta, Zn, Cu, Ag, Au, Gd, Tb, Dy, Ho, Er, Fe, Ru, Tm, Yb, and Lu, and Z is at least one element selected from a group consisting of Al, Si, Ga, Ge, In, Sn, Sb, Pb, Mg, Sr, and Bi.

(3) In the spin-orbit-torque magnetization rotating element according to an aspect, a main framework of the spin-orbit torque wiring may have a structure including any of an $L2_1$ structure, a B2 structure, and an A2 structure in a case where the compound is represented by $X_2YZ$ and have a structure including any of a $C1_b$ structure, the B2 structure, and the A2 structure in a case where the compound is represented by XYZ.

(4) In the spin-orbit-torque magnetization rotating element according to an aspect, the main framework of the spin-orbit torque wiring may have a structure including any of the B2 structure and the A2 structure in a case where the compound is represented by $X_2YZ$ and have a structure including any of the B2 structure and the A2 structure in a case where the compound is represented by XYZ.

(5) In the spin-orbit-torque magnetization rotating element according to an aspect, in the compound, a value obtained by adding the number of outermost shell electrons of an X element, a Y element, and a Z element may be 21 or less in a case where a composition of the compound is represented by XYZ and be 27 or less when the composition of the compound is represented by $X_2YZ$.

(6) In the spin-orbit-torque magnetization rotating element according to an aspect, the spin-orbit torque wiring may be made of an antiferromagnetic material.

(7) In the spin-orbit-torque magnetization rotating element according to an aspect, the X element, the Y element, or the Z element in the compound may include an element of the fifth period or higher in the periodic table.

(8) In the spin-orbit-torque magnetization rotating element according to an aspect, the compound may be represented by XYZ in the stoichiometric composition.

(9) In the spin-orbit-torque magnetization rotating element according to an aspect, the first ferromagnetic layer may include a ferromagnetic material represented by XYZ or $X_2YZ$ in the stoichiometric composition, X may be at least one element selected from a group consisting of Fe, Co, Ni, Cu, Zn, Ru, Rh, Pd, Ag, Cd, Ir, Pt, and Au, Y may be at least one element selected from a group consisting of Ti, V, Cr, Mn, Y, Zr, Nb, Hf, Ta, Gd, Tb, Dy, Ho, Er, Fe, Tm, Yb, and Lu, and Z may be at least one element selected from a group consisting of Al, Si, Ga, Ge, As, In, Sn, Sb, Tl, Pb, and Bi.

(10) In the spin-orbit-torque magnetization rotating element according to an aspect, the first ferromagnetic layer may include a ferromagnetic material represented by $Co_2YZ$ in the stoichiometric composition, Y may be at least one of Mn and Fe, and Z may be at least one element selected from a group consisting of Al, Si, Ga, and Ge.

(11) A spin-orbit-torque magnetoresistance effect element according to a third aspect includes: the spin-orbit-torque magnetization rotating element according to the aspect; a second ferromagnetic layer facing the first ferromagnetic layer at a position on the first ferromagnetic layer opposite to the spin-orbit torque wiring; and a non-magnetic layer sandwiched between the first ferromagnetic layer and the second ferromagnetic layer.

(12) A magnetic memory according to a fourth aspect includes: a plurality of the spin-orbit-torque magnetoresistance effect elements according to the above aspect.

Advantageous Effects of Invention

A spin-orbit-torque magnetization rotating element, a spin-orbit-torque magnetoresistance effect element, and a magnetic memory capable of efficiently generating a spin current can be provided.

DESCRIPTION OF EMBODIMENTS

An embodiment will be described in detail below with reference to the drawings as appropriate. In the drawings used in the following description, in order to facilitate understanding of the features of the embodiment, for the sake of convenience, enlarged characteristic portions are illustrated in some cases and dimensional ratios between the constituent elements and the like may be different from the actual dimensional ratios in some cases. The materials, dimensions, and the like exemplified in the following description are mere examples and the embodiment is not limited thereto and the embodiment can be implemented through appropriate modifications without departing from the gist of the present invention.

First Embodiment

Figure 1:
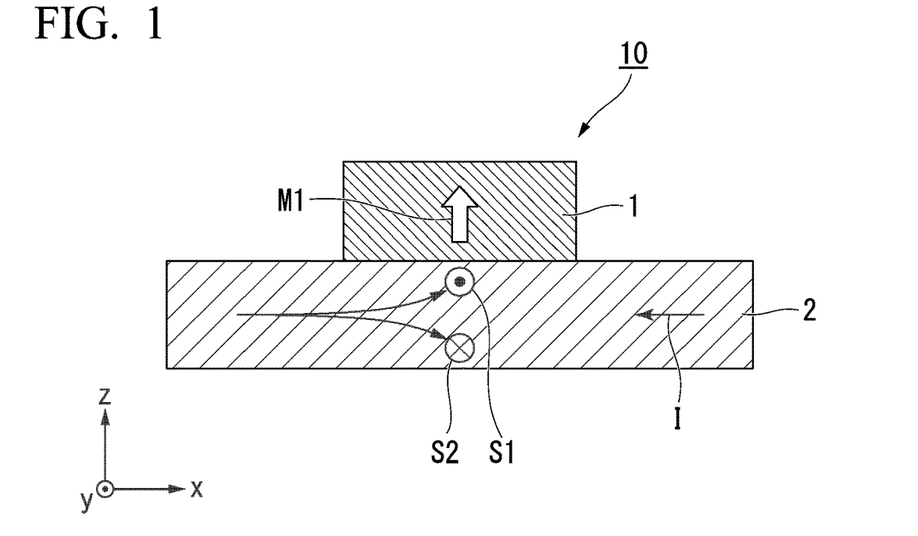
FIG. 1 is a schematic cross-sectional view of a spin-orbit-torque magnetization rotating element according to a first embodiment.

FIG. 1 is a cross-sectional view schematically illustrating a spin-orbit-torque magnetization rotating element according to a first embodiment. A spin-orbit-torque magnetization rotating element 10 according to the first embodiment includes a first ferromagnetic layer 1 and a spin-orbit torque wiring 2.

Description will be provided below in a state in which a first direction in which the spin-orbit torque wiring 2 extends is defined as an x direction, a direction orthogonal to the first direction in a plane in which the spin-orbit torque wiring 2 is present is defined as a y direction, and a direction orthogonal to both the x direction and the y direction is defined as a z direction. In FIG. 1, the z direction coincides with a lamination direction of the first ferromagnetic layer 1 and a thickness direction of the spin-orbit torque wiring 2.
<Spin-Orbit Torque Wiring>

The spin-orbit torque wiring 2 extends in the x direction. The spin-orbit torque wiring 2 generates a spin current using a spin Hall effect when a current flows therethrough. A spin Hall effect is a phenomenon in which a spin current is induced in a direction orthogonal to a current direction on the basis of spin-orbit interaction when a current flows through a wiring. A mechanism by which a spin current is generated using the spin Hall effect will be described.

As illustrated in FIG. 1, when a potential difference is applied to both ends of the spin-orbit torque wiring 2 in the x direction, a current I flows in the x direction. When the current I flows, a first spin S1 oriented in the y direction and a second spin S2 oriented in a −y direction are each bent in a direction orthogonal to that of the current. Although a normal Hall effect and the spin Hall effect are the same in that a moving (traveling) direction of moving (traveling) electric charges (electrons) is bent, the normal Hall effect and the spin Hall effect significantly differ in that charged particles moving in a magnetic field are subjected to a Lorentz force due to the normal Hall effect and thus the moving direction thereof is bent, the traveling direction thereof is bent only by the movement of electrons (only the flowing of a current) due to the spin Hall effect even though there is no magnetic field.

When the spin-orbit torque wiring 2 is made of a non-magnetic material (a material which is not a ferromagnetic material), the number of electrons of the first spin S1 is equal to the number of electrons of the second spin S2. That is to say, in the drawings, the number of electrons of the first spin S1 going upward is equal to the number of electrons of the second spin S2 going downward. In this case, a current as a net flow of electric charges is zero. A spin current which does not involve such a current is particularly referred to as a pure spin current.

Here, when a flow of electrons of the first spin S1 is represented by $J\uparrow$, a flow of electrons of the second spin S2 is represented by $J\downarrow$, and a spin current is represented by JS, they are defined by $JS=J\uparrow-J\downarrow$. In FIG. 1, JS as the pure spin current flows in the z direction in FIG. 1. Here, JS is a flow of electrons with a polarization of 100%.

In FIG. 1, when a ferromagnetic material is brought into contact with an upper surface of the spin-orbit torque wiring 2, a spin current diffuses and flows into the ferromagnetic material. That is to say, spins are injected into the first ferromagnetic layer 1.

The spin-orbit torque wiring 2 associated with this embodiment includes a compound represented by XYZ or $X_2YZ$ with respect to a stoichiometric composition. In a composition expression, X is one or more elements selected from a group consisting of Fe, Co, Ni, Mn, Re, Ru, Os, Rh, Pd, Ir, and Pt, Y is one or more elements selected from a group consisting of Ti, V, Cr, Mo, W, Ta, Mn, Re, Os, Zr, Nb, Hf, Ta, Zn, Cu, Ag, Au, Gd, Tb, Dy, Ho, Er, Fe, Ru, Tm, Yb, and Lu and different from an X element, and Z is one or more elements selected from a group consisting of Al, Si, Ga, Ge, In, Sn, Sb, Pb, Mg, Sr, and Bi.

Here, the expression "represented by XYZ or $X_2YZ$ with respect to a stoichiometric composition" refers to not only when a compound has a stoichiometric composition but also when the compound has a non-stoichiometric composition. That is to say, when a composition expression is XYZ, a ratio between the X element, the Y element, and the Z element need not be exactly 1:1:1. In addition, when the composition expression is $X_2YZ$, a ratio between the X element, the Y element, and the Z element need not be exactly 2:1:1.

This compound is a Heusler alloy in a broad sense. A ferromagnetic material Heusler alloy has been researched as a material that is highly likely to achieve a spin polarizability of 100% at room temperature. A ferromagnetic Heusler alloy represented by XYZ is known as a half Heusler alloy and a ferromagnetic Heusler alloy represented by $X_2YZ$ is known as a full Heusler alloy. "The Heusler alloy in a broad sense" in this specification refers to a typical intermetallic compound based on a bcc structure represented by XYZ or $X_2YZ$. That is to say, "the Heusler alloy in a broad sense" may be a non-magnetic material, a ferromagnetic material or an antiferromagnetic material.

When the spin-orbit torque wiring 2 includes the compound, the spin Hall effect strongly occurs in the spin-orbit torque wiring 2 and an amount of spin injected from the spin-orbit torque wiring 2 into the first ferromagnetic layer 1 increases. The injected spins imparts a spin-orbit torque to the magnetization of the first ferromagnetic layer 1 and causes magnetization rotation (a magnetization reversal).

When the spin-orbit torque wiring 2 efficiently generates a spin current (the spin Hall effect strongly works), spins are injected into the first ferromagnetic layer 1 to increase an amount of spin. The spin current is caused by intrinsic reasons associated with the constitution of the spin-orbit torque wiring 2 and exogenous reasons which can be externally applied to the spin-orbit torque wiring 2.

The intrinsic reasons include an influence of a material constituting the spin-orbit torque wiring 2, an influence by an internal field caused by the collapse of the symmetry of a crystal structure or the like, and the like. When a material having a strong spin-orbit interaction is used as a material constituting the spin-orbit torque wiring 2, a spin current is efficiently generated. When crystals constituting the spin-orbit torque wiring 2 are assumed to have an inversion symmetry which has collapsed, an internal field which promotes the spin Hall effect occurs and a spin current is efficiently generated.

On the other hand, the exogenous reasons include an influence of scattering factors included in the spin-orbit torque wiring 2, an influence of distortion of a lamination interface, an interfacial Rashba effect, and the like. When impurities or the like scatter spins, the spin-orbit interaction is enhanced and the generation efficiency of a spin current with respect to a current flowing through the spin-orbit torque wiring 2 increases. When a lamination interface between the spin-orbit torque wiring 2 and another layer is distorted, an internal field which promotes the spin Hall effect occurs and a spin current is efficiently generated. Furthermore, when a lamination interface is made of different materials, a spin current is efficiently generated due to an interfacial Rashba effect.

Figure 2A:
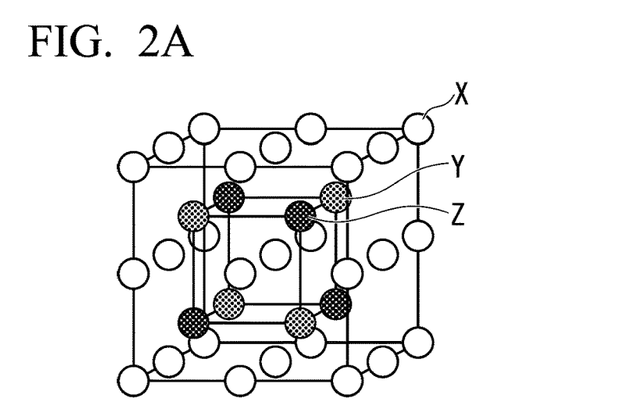
FIG. 2A is a schematic diagram of a crystal structure forming a main framework of a spin-orbit torque wiring.
Figure 2B:
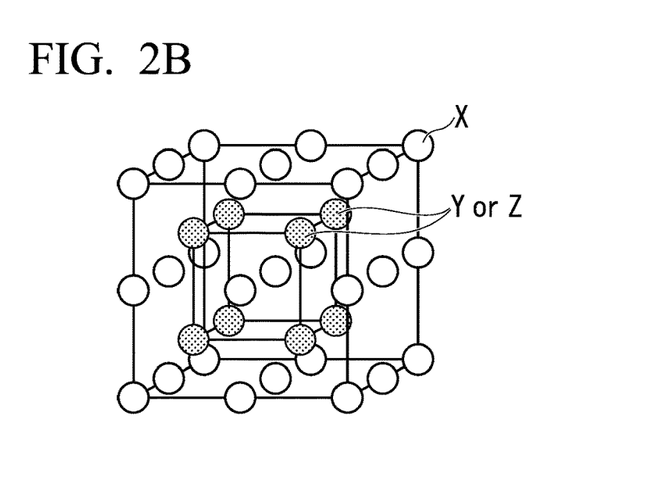
FIG. 2B is a schematic diagram of a crystal structure forming a main framework of a spin-orbit torque wiring.
Figure 2C:
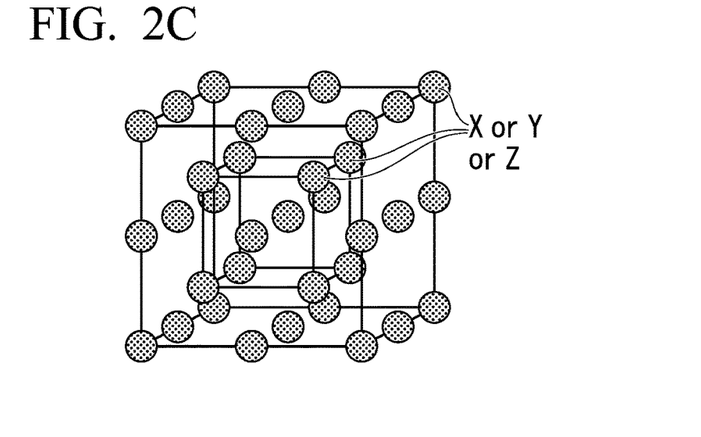
FIG. 2C is a schematic diagram of a crystal structure forming a main framework of a spin-orbit torque wiring.
Figure 2D:
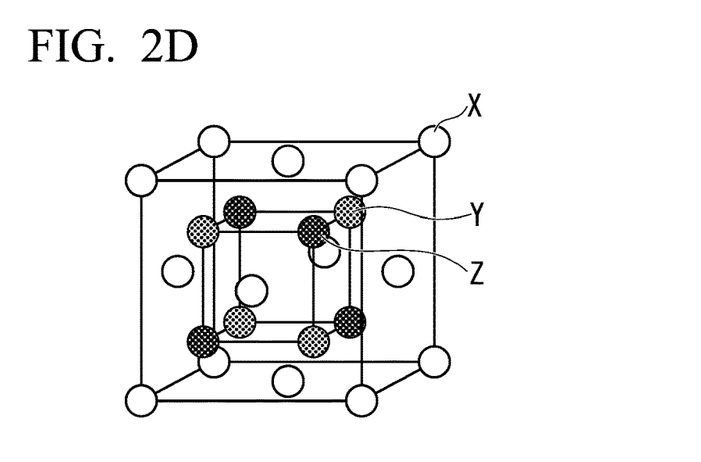
FIG. 2D is a schematic diagram of a crystal structure forming a main framework of a spin-orbit torque wiring.
Figure 2E:
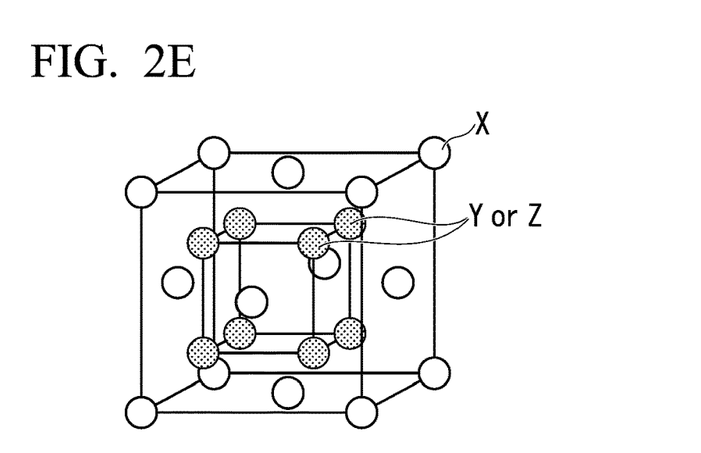
FIG. 2E is a schematic diagram of a crystal structure forming a main framework of a spin-orbit torque wiring.
Figure 2F:
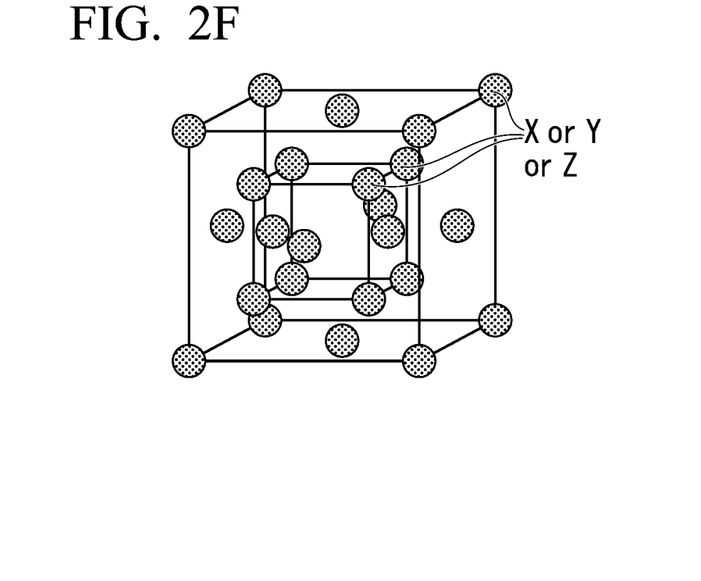
FIG. 2F is a schematic diagram of a crystal structure forming a main framework of a spin-orbit torque wiring.

FIGS. 2A to 2F are diagrams schematically illustrating crystal structures in which compounds represented by composition expressions represented as XYZ or $X_2YZ$ are easily selected. FIGS. 2A to 2C illustrate crystal structures in which compounds represented by the composition expression represented as $X_2YZ$ are easily selected and FIGS. 2D to 2F illustrate crystal structures in which compounds represented by the composition expression represented as XYZ are easily selected.

FIG. 2A illustrates an $L2_1$ structure, FIG. 2D illustrates a $C1_b$ structure, and X atoms, Y atoms, and Z atoms are included at predetermined sites. A unit lattice of an $L2_1$ structure composed of four face-centered cubic lattices (fcc) and a $C1_b$ structure is a structure in which one X atom among these is eliminated.

FIG. 2B illustrates a B2 structure derived from the $L2_1$ structure and FIG. 2E illustrates a B2 structure derived from the $C1_b$ structure. In these crystal structures, X atoms are included at predetermined sites and disorder occurs between Y atoms and Z atoms. FIG. 2C illustrates an A2 structure derived from the $L2_1$ structure and FIG. 2F illustrates an A2 structure derived from the $C1_b$ structure. In these crystal structures, there is disorder between X atoms, Y atoms, and Z atoms. Therefore, the crystallinity of the compounds represented by the composition expression represented as $X_2YZ$ is higher in the order of the $L2_1$ structure>the B2 structure>the A2 structure and the crystallinity of the compounds represented by the composition expression represented as XYZ is higher in the order of the $C1_b$ structure>the B2 structure>the A2 structure.

It is desirable that a main framework of the spin-orbit torque wiring 2 have a structure including any of the $L2_1$ structure, the B2 structure, and the A2 structure when a compound thereof is represented by $X_2YZ$ and have a structure including any of the $C1_b$ structure, the B2 structure, and the A2 structure when the compound thereof is represented by XYZ. Here, the expression "a structure including" also refers to including, for example, a case in which a part of the $L2_1$ structure or the $C1_b$ structure is the A2 structure or the B2 structure.

Although FIGS. 2A to 2F illustrate sizes of the X atoms, the Y atoms, and the Z atoms as being substantially the same for the sake of illustration, atomic radii of the X atoms, the Y atoms, and the Z atoms are actually different. When the extent of the electron cloud of the X atoms, the Y atoms, and the Z atoms is included, the magnitudes of the spin interactions produced by the atoms are different. Therefore, in view of electrons (spins) flowing in the spin-orbit torque wiring 2 due to the flowing of the current I, directions and magnitudes of a vector subjected to the interactions are asymmetric in accordance with locations.

Also, compounds represented by XYZ and $X_2YZ$ are compounds represented as a ternary type or higher and are likely to cause disorder (turbulence) in a crystal structure. This is because the X atoms, the Y atoms, and the Z atoms have influences on each other and inhibit migration to a predetermined position. In fact, it can be said that a ferromagnetic Heusler alloy theoretically can achieve a spin polarization of 100%, but it can be said that the ferromagnetic Heusler alloy does not reach 100% because the ferromagnetic Heusler alloy has an influence on the disorder on this crystal structure. In addition, such compounds are compounds in which the disorder is easily generated.

As described above, the collapse of the symmetry in the spin-orbit torque wiring 2 is one of the intrinsic reasons of generating a spin current. The collapse of the symmetry in the spin-orbit torque wiring 2 causes an internal field which promotes the spin Hall effect and the generation efficiency of the spin current increases. Therefore, when the spin-orbit torque wiring 2 includes the compounds, an amount of spin diffusing from the spin-orbit torque wiring 2 into the first ferromagnetic layer 1 increases and it is possible to apply a large spin-orbit torque to the magnetization of the first ferromagnetic layer 1.

In order to further promote the asymmetry of a crystal structure, it is desirable that the main framework of the spin-orbit torque wiring 2 have a structure including any of the B2 structure and the A2 structure when the compound thereof is represented by $X_2YZ$ and have a structure including any of the B2 structure and the A2 structure when the compound thereof is represented by XYZ.

It is desirable that X atoms, Y atoms, or Z atoms in a compound include elements of the fifth period or higher in the periodic table and it is desirable that the X atoms, the Y atoms, or the Z atoms be non-magnetic metal elements having a large atomic number with an atomic number of 39 or more having d electrons or f electrons in the outermost shell thereof. Examples of compounds which satisfy this include $Fe_2TiSn$, NiZrSn, and the like.

Normally, when a current flows through a metal, all electrons move in a direction opposite to that of the current irrespective of the directions of the spins thereof. On the other hand, since a non-magnetic metal having a large atomic number having d electrons or f electrons in the outermost shell thereof has a large spin-orbit interaction, a direction in which the electrons moves due to the spin Hall effect depends on the direction of the spins of the electrons and a spin current easily occurs.

In the compound constituting the spin-orbit torque wiring 2, a value obtained by adding the number of outermost shell electrons of the X atoms, the Y atoms, and the Z atoms is preferably 21 or less in a case where a composition of the compound is represented by XYZ and is preferably 27 or less when the composition of the compound is represented by $X_2YZ$. Furthermore, this value is more preferably 15 or more and 21 or less, further preferably 16 or more and 20 or less, particularly preferably 17 or more and 19 or less, and most preferably 18 when the composition of the compound is represented by XYZ. Moreover, this value is more preferably 21 or more and 27 or less, further preferably 22 or more and 26 or less, particularly preferably 23 or more and 25 or less, and most preferably 24 when the composition of the compound is represented by $X_2YZ$.

Examples of the compound of which a composition is represented by XYZ and in which the number of outermost shell electrons thereof is 18 include XYZ (X=Mn, Re; Y=Cr, Mo, W; Z=Sb, Bi), XYZ (X=Fe, Ru, Os; Y=Mn, Re; Z=Al, Ga, in), XYZ (X=Fe, Ru, Os; Y=Cr, Mo, W; Z=Si, Ge, Sn, Pb), XYZ (X=Fe, Ru, Os; Y=V, Nb, Ta; Z=Sb, Bi), XYZ (X=Co, Rh, Ir; Y=Mn, Re; Z=Mg, Sr), XYZ (X=Co, Rh, Ir; Y=Cr, Mo, W; Z=Al, Ga, In), XYZ (X=Co, Rh, Ir; Y=V, Ta, Nb; Z=Si, Ge, Sn, Pb), XYZ (X=Co, Rh, Ir; Y=Ti, Zr, Hf; Z=Sb, Bi), XYZ (X=Ni, Pd, Pt; Y=Cr, Mo, W; Z=Mg, Sr), XYZ (X=Ni, Pd, Pt; Y=V, Nb, Ta; Z=Al, Ga, In), XYZ (X=Ni, Pd, Pt; Y=Ti, Zr, Hf; Z=Si, Ge, Sn, Pb), and XYZ (X=Ni, Pd, Pt; Y=Gd, Tb, Dy, Ho, Er, Tm, Yb, Lu; Z=Sb, Bi). Furthermore, at least one element or two or more kinds of element may be added to these materials to an extent that the spin Hall effect is not impaired. It should be noted that the above combinations may be YXZ. In this case, in the case of the B2 structure, X and Z may be irregularly arranged.

Examples of the compound of which a composition is represented by $X_2YZ$ and in which the number of outermost shell electrons thereof satisfies 24 include $X_2YZ$ (X=Fe, Ru, Os; Y=Cr, Mo, W; Z=Mg, Sr), $X_2YZ$ (X=Fe, Ru, Os; Y=V, Nb, Ta; Z=Al, Ga, In), $X_2YZ$ (X=Fe, Ru, Os; Y=Ti, Zr, Hf; Z=Si, Ge, Sn, Pb), $X_2YZ$ (X=Fe, Ru, Os; Y=Gd, Tb, Dy, Ho, Er, Tm, Yb, Lu: Z=Sb, Bi), $X_2YZ$ (X=Co, Rh, Ir; Y=Zn; Z=Si, Ge, Sn, Pb), $X_2YZ$ (X=Co, Rh, Ir; Y=Cu, Ag, Au: Z=Sb, Bi), $X_2YZ$ (X=Co, Rh, Ir; Y=Ti, Zr, Hf; Z=Mg, Sr), $X_2YZ$ (X=Co, Rh, Ir; Y=Gd, Tb, Dy, Ho, Er, Tm, Yb, Lu; Z=Al, Ga, In), $X_2YZ$ (X=Mn, Re; Y=Fe, Ru, Os; Z=Mg, Sr), $X_2YZ$ (X=Mn, Re: Y=Cr, Mo, W: Z=Si, Ge, Sn, Pb), $X_2YZ$ (X=Mn, Re: Y=V, Nb, Ta; Z=Sb, Bi), $X_2YZ$ (X=Ni, Pd, Pt; Y=Zn; Z=Mg, Sr), and $X_2YZ$ (X=Ni, Pd, Pt; Y=Cu, Ag, Au; Z=Al, Ga, In). Furthermore, at least one element or two or more kinds of element may be added to these material to an extent that the spin Hall effect is not impaired.

In a case where a composition of the compound is represented by XYZ, the magnitude of a magnetic moment per atom obtained through a Hunt rule is 4 µB at the number of outermost shell electrons of 22. Furthermore, when the composition of the compound is represented by $X_2YZ$, the magnitude of a magnetic moment per atom obtained through the Hunt rule is 4 µB at the number of outermost shell electrons of 28. It can be said that the magnitude of a magnetic moment per atom exhibits a strong ferromagnetism when exceeding 4 µB. On the other hand, the compound is a completely non-magnetic material in a case where a composition of the compound is represented by XYZ and the number of outermost shell electrons thereof is 18 and the compound is a completely non-magnetic material when the composition of the compound is represented by $X_2YZ$ and the number of outermost shell electrons thereof is 24. Identification of magnetism and non-magnetism using the number of outermost shell electrons generally coincides with the result of first principle calculation including the orbit interaction.

When the spin-orbit torque wiring 2 is a non-magnetic material, as described above, the number of electrons of the first spin S1 is equal to the number of electrons of the second spin S2 and a current as a net flow of electric charges is zero. That is to say, if the number of outermost shell electrons is within the above range, it is possible to minimize the occurrence of unintended current accompanying a spin current in the spin-orbit torque wiring 2. Furthermore, if the number of outermost shell electrons is within the above range, the spin-orbit torque wiring 2 does not exhibit a strong magnetism. That is to say, it is possible to minimize an influence of a magnetic field generated by the spin-orbit torque wiring 2 on a magnetization direction of the first ferromagnetic layer 1.

Also, the spin-orbit torque wiring 2 may be made of an antiferromagnetic material. Examples of the antiferromagnetic material include $Ni_2MnAl$, $Ru_2MnX$ (X=Ge, Sn, Sb, Ga, Si), $Pd_2MnX$ (X=Al, In), $Ir_2MnX$ (X=Al, Ga), $Pt_2MnX$ (X=Al, Ga), $Mn_2VX$(X=Al, Si), and the like. Furthermore, at least one kind or more kinds of element may be added to these material to an extent that antiferromagnetic properties are not impaired.

When the spin-orbit torque wiring 2 is made of an antiferromagnetic material, it is possible to induce exchange magnetic coupling at an interface between the spin-orbit torque wiring 2 and the first ferromagnetic layer 1 and it is possible to enhance the spin Hall effect.

In order to induce a stronger spin Hall effect in the spin-orbit torque wiring 2, a composition of a compound is preferably XYZ, and it is reduce heat generation in the spin-orbit torque wiring 2, the composition thereof is $X_2YZ$.

A structure obtained by eliminating one X atom of a unit lattice of the $L2_1$ structure ($X_2YZ$: FIG. 2A) is the $C1_b$ structure (XYZ: FIG. 2D). For this reason, the $C1_b$ structure has vacant lattice points compared with the $L2_1$ structure. In the $C1_b$ structure having vacant lattice points, it is difficult for electrons to move compared with the $L2_1$ structure which does not have vacant lattice points, which becomes a high resistivity material. The high resistivity material is a material with strong spin-orbit interaction and a spin current is generated efficiently. Furthermore, the $C1_b$ structure having the vacant lattice points has a crystal structure with a low stability. Unless the crystal structure is stabilized, the crystal structure easily becomes an asymmetric crystal structure. An internal field accompanying the asymmetry disturbance promotes the spin Hall effect and a spin current is generated efficiently.

The spin-orbit torque wiring 2 may include other materials at the same time as long as the spin-orbit torque wiring 2 mainly has the compound as a constituent element.

For example, the spin-orbit torque wiring 2 may include a magnetic metal. The magnetic metal refers a ferromagnetic metal or an antiferromagnetic metal. When a small amount of magnetic metal is contained in the spin-orbit torque wiring 2, the magnetic metal serves as a scattering factor of spins. That is to say, the spin-orbit interaction is enhance and the generation efficiency of the spin current with respect to the current flowing through the spin-orbit torque wiring 2 increases.

On the other hand, when an amount of magnetic metal to be added is excessively increased, the generated spin current is scattered due to the added magnetic metal, and as a result, an action of decreasing the spin current is strong in some cases. For this reason, it is desirable that a molar ratio of the added magnetic metal be sufficiently smaller than a total molar ratio of the elements constituting the spin-orbit torque wiring 2. Speaking as a guide, the molar ratio of the added magnetic metal is preferably 3% or less.

Also, for example, the spin-orbit torque wiring 2 may include a topological insulator. The spin-orbit torque wiring 2 may be mainly made of a topological insulator as a constituent element. The topological insulator is a material whose interior is an insulator or a high resistance body and in which a spin-polarized metal state is generated on its surface. This material has an internal magnetic field called spin-orbit interaction. Thus, even if there is no external magnetic field, a new topological phase develops due to a spin-orbit interaction effect. This is a topological insulator and it is possible to generate a spin current with high efficiency using strong spin-orbit interaction and breaking of inversion symmetry at an edge thereof.

Examples of the topological insulator include SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$, and the like. These topological insulators can generate a spin current with high efficiency.

Also, for example, the spin-orbit torque wiring 2 may have a plurality of laminated structures. For example, a laminated structure in which a first layer represented by a composition expression represented by XYZ which easily induces a spin Hall effect and a second layer represented by a composition expression represented by $X_2YZ$ which has excellent heat dissipation may be provided. In this case, the first layer which easily induces a spin Hall effect is disposed on the first ferromagnetic layer 1 side.

<First Ferromagnetic Layer>

The first ferromagnetic layer 1 functions when the orientation of the magnetization M1 thereof changes. Although the first ferromagnetic layer 1 is a vertical magnetized film in which the magnetization M1 is oriented in the z direction in FIG. 1, the first ferromagnetic layer 1 may be an in-plane magnetized film in which the magnetization M1 is oriented in an xy in-plane direction.

A ferromagnetic material, particularly, a soft magnetic material can be applied to the first ferromagnetic layer 1. For example, a metal selected from a group consisting of Cr, Mn, Co, Fe, and Ni, an alloy containing at least one of these metals, an alloy containing at least one of these metals and at least one element of B, C, and N, and the like can be used. To be specific, Co—Fe, Co—Fe—B, and Ni—Fe can be exemplified.

Also, a ferromagnetic Heusler alloy may be used for the first ferromagnetic layer 1. To be specific, it is desirable that the first ferromagnetic layer be a ferromagnetic material represented by XYZ or $X_2YZ$ in the stoichiometric composition. Here, X is at least one element selected from a group consisting of Fe, Co, Ni, Cu, Zn, Ru, Rh, Pd, Ag, Cd, Ir, Pt, and Au, Y is at least one element selected from a group consisting of Ti, V, Cr, Mn, Y, Zr, Nb, Hf, Ta, Gd, Tb, Dy, Ho, Er, Fe, Tm, Yb, and Lu, and Z is at least one element selected from a group consisting of Al, Si, Ga, Ge, As, In, Sn, Sb, Tl, Pb, and Bi. $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like may be exemplified.

Also, it is desirable that the first ferromagnetic layer 1 include a ferromagnetic material represented by $Co_2YZ$ in the stoichiometric composition, Y be at least one of Mn and Fe, and Z be at least one element selected from a group consisting of Al, Si, Ga, and Ge.

When crystal structures of the spin-orbit torque wiring 2 and the first ferromagnetic layer 1 are the same or similar, a high quality first ferromagnetic layer 1 can be prepared through epitaxial growth. By increasing the crystallinity of the first ferromagnetic layer 1, it is possible to realize a high spin polarization.

As described above, in the spin-orbit-torque magnetization rotating element 10 according to this embodiment, when the spin-orbit torque wiring 2 is a broadly defined Heusler alloy, the symmetry in the spin-orbit torque wiring 2 collapses. The collapse of the symmetry induces an internal field and a spin Hall effect works strongly due to this internal field. As a result, the spin polarization is promoted and an amount of spin injected into the first ferromagnetic layer 1 increases. That is to say, according to the spin-orbit-torque magnetization rotating element associated with this embodiment, it is possible to reduce a current density required for rotating the magnetization M1 of the first ferromagnetic layer 1.

A spin current magnetization rotation element according to this embodiment can be applied to a magnetoresistance effect element as will be described later. However, the usage is not limited to the magnetoresistance effect element and the present invention can also be applied to other usages. As another usage, for example, the present invention can also be used in a spatial light modulator in which the above-described spin current magnetization rotation element is arranged in each pixel and incident light is spatially modulated using a magneto-optical effect. In addition, in order to prevent a hysteresis effect due to the coercivity of a magnet in the magnetic sensor, a magnetic field applied to an easy axis of the magnetization of the magnet may be replaced by an SOT. When the magnetization is reversed, the spin current magnetization rotation element can be particularly referred to as a spin current magnetization reversal element.

<Manufacturing Method>

An example of a method for manufacturing the spin-orbit-torque magnetization rotating element 10 will be described. First, a layer serving as the base of a spin-orbit torque wiring is laminated on a substrate (not shown). The spin-orbit torque wiring includes an X element, a Y element, and a Z element. For this reason, the layer serving as the base of the spin-orbit torque wiring is laminated using a base material including the respective elements. Examples of a lamination method include a known method such as a sputtering method, a chemical vapor deposition (CVD) method, a molecular beam epitaxy (MBE) method, or the like.

Subsequently, the layer serving as the base of the spin-orbit torque wiring is annealed. In a case in which a composition of a compound is represented by XYZ, when an annealing temperature increases, a structure thereof changes in order of an A2 structure, a B2 structure, and a $C1_b$ structure. In addition, in a case in which the composition of the compound is represented by $X_2YZ$, when the annealing temperature increases, the structure changes in order of the A2 structure, the B2 structure, and the $L2_1$ structure.

Subsequently, the layer serving as the base of the spin-orbit torque wiring is processed into the spin-orbit torque wiring 2 using a technique such as photolithography. Moreover, an insulating layer is covered to surround the periphery of the spin-orbit torque wiring 2. An oxide film, a nitride film, or the like can be used as the insulating layer.

Subsequently, surfaces of the insulating layer and the spin-orbit torque wiring are planarized using chemical mechanical polishing (CMP) if necessary. Moreover, the layer serving as the base of the first ferromagnetic layer is laminated above the planarized surface. Finally, the spin-orbit-torque magnetization rotating element 10 is obtained by processing the layer serving as the base of the first ferromagnetic layer using a technique such as photolithography.

Second Embodiment

<Spin-Orbit-Torque Magnetoresistance Effect Element>

Figure 3:
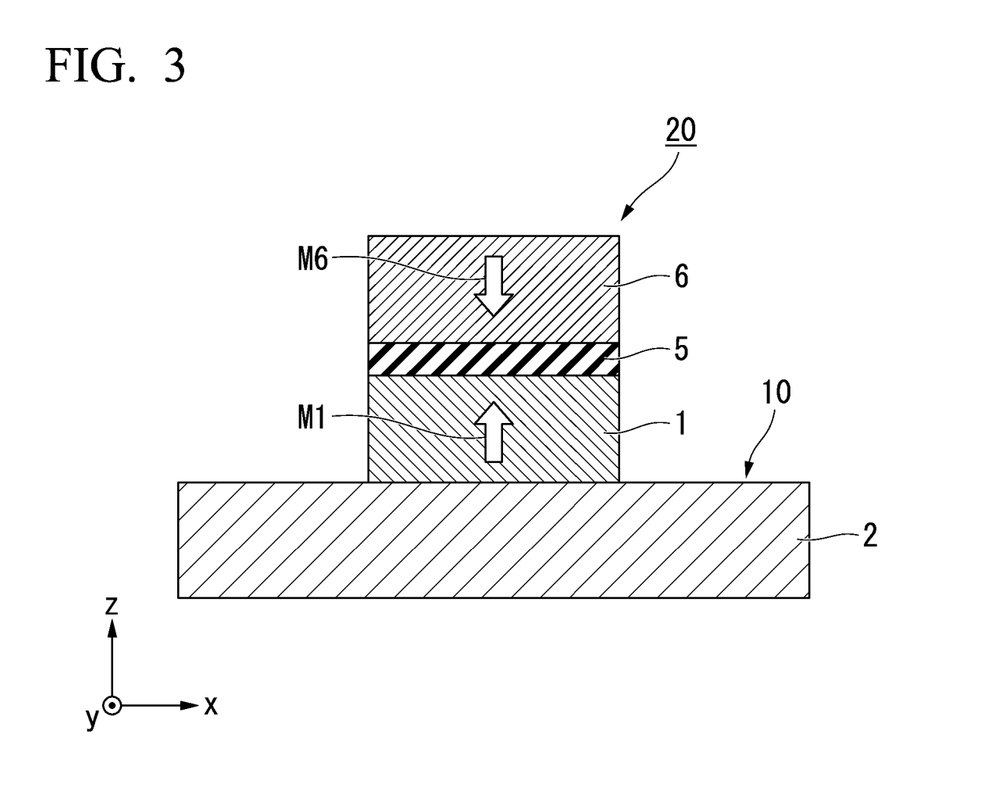
FIG. 3 is a schematic cross-sectional view of a spin-orbit-torque magnetoresistance effect element according to a second embodiment.

FIG. 3 is a schematic cross-sectional view of a spin-orbit-torque magnetoresistance effect element 20 according to a second embodiment. The spin-orbit-torque magnetoresistance effect element 20 illustrated in FIG. 3 includes a spin-orbit-torque magnetization rotating element 10, a non-magnetic layer 5, and a second ferromagnetic layer 6. A description of a constitution of the spin-orbit-torque magnetoresistance effect element 20 that is the same as that of the spin-orbit-torque magnetization rotating element 10 in the first embodiment will be omitted.

A laminate (a functional unit) obtained by laminating a first ferromagnetic layer 1, the non-magnetic layer 5, and the second ferromagnetic layer 6 functions in the same manner as in a normal magnetoresistance effect element. The functional unit functions when the magnetization M6 of the second ferromagnetic layer 6 is fixed in one direction (the z direction) and the orientation of the magnetization M1 of the first ferromagnetic layer 1 relatively changes. When the functional unit is applied to a coercivity difference type (pseudo spin valve type) MRAM, the coercivity of the second ferromagnetic layer 6 is larger than the coercivity of the first ferromagnetic layer 1. When the functional unit is applied to an exchange bias type (spin value type) MRAM, the magnetization M6 of the second ferromagnetic layer 6 is fixed through the exchange coupling with an antiferromagnetic layer.

Also, the functional unit has the same constitution as a tunneling magnetoresistance (TMR) element when the non-magnetic layer 5 is made of an insulator in the functional unit and has the same constitution as a giant magnetoresistance (GMR) element when the functional unit is made of a metal.

A known lamination constitution of the magnetoresistance effect element can be adopted as a lamination constitution of the functional unit. For example, each layer may be composed of a plurality of layers or may include another layer such as an antiferromagnetic layer which fixes a magnetization direction of the second ferromagnetic layer 6. The second ferromagnetic layer 6 is referred to as a fixed layer or a reference layer and the first ferromagnetic layer 1 is referred to as a free layer, a storage layer, or the like.

A known material can be used as a material of the second ferromagnetic layer 6. For example, a metal selected from a group consisting of Cr, Mn, Co, Fe, and Ni and an alloy which contains at least one of these metals and exhibits the ferromagnetism can be used. An alloy which contains at least one of these metals and at least one element of B, C, and N can also be used. To be specified, Co—Fe and Co—Fe-Bc may be exemplified.

Also, in order to obtain a higher output, it is desirable to use a Heusler alloy such as $Co_2FeSi$ for a material of the second ferromagnetic layer 6. A Heusler alloy contains an intermetallic compound having a chemical composition represented by XYZ or $X_2YZ$. Here, X is a transition metal element or a noble metal element from the Co, Fe, Ni, or Cu groups in the periodic table, Y is a transition metal from the Mn, V, Cr, or Ti groups or an element of the X type, and Z is a typical element from Group 111 to Group V. For example, $Co_2FeSi$, $Co_2MnSi$, $Co_2Mn_{1-a}Fe_aAl_bSi_{1-b}$, and the like may be exemplified.

In order to further increase the coercivity of the second ferromagnetic layer 6 with respect to the first ferromagnetic layer 1, an antiferromagnetic material such as IrMn and PtMn may be used as a material in contact with the second ferromagnetic layer 6. Furthermore, in order to prevent a leakage magnetic field of the second ferromagnetic layer 6 from affecting the first ferromagnetic layer 1, a synthetic ferromagnetic coupling structure may be adopted.

A known material can be used for the non-magnetic layer 5.

For example, when the non-magnetic layer 5 is made of an insulator (in the case of a tunnel barrier layer), $Al_2O_3$, $SiO_2$, MgO, $MgAl_2O_4$, or the like can be used as a material thereof. Furthermore, in addition to these materials, materials in which a part of Al, Si, and Mg is substituted with Zn, Be, or the like can also be used. Among them, since MgO and $MgAl_2O_4$ are materials which can realize coherent tunneling, spins can be efficiently injected. When the non-magnetic layer 5 is made of a metal, Cu, Au, Ag, or the like can used as a material thereof. Furthermore, when the non-magnetic layer 5 is made of a semiconductor, Si, Ge, $CuInSe_2$, $CuGaSe_2$, Cu(In, Ga)$Se_2$, or the like can be used as a material thereof.

The functional unit may include other layers. For example, an underlayer may be provided on a surface of the first ferromagnetic layer 1 opposite to the non-magnetic layer 5 and a cap layer may be provided on a surface of the second ferromagnetic layer 6 opposite to the non-magnetic layer 5.

It is desirable that a layer arranged between the spin-orbit torque wiring 2 and the first ferromagnetic layer 1 does not dissipate spins propagating from the spin-orbit torque wiring 2. For example, it is known that silver, copper, magnesium, aluminum, and the like have a long spin diffusion length of 100 nm or more and spins are difficult to dissipate.

Also, it is desirable that a thickness of this layer be a spin diffusion length or less of a material constituting the layer. When the thickness of the layer is the spin diffusion length or less, it is possible to sufficiently transmit the spins propagating from the spin-orbit torque wiring 2 to the first ferromagnetic layer 1.

The spin-orbit-torque magnetoresistance effect element according to the second embodiment can record and read data using a change in resistance value of the functional unit caused due to a difference between relative angles of the magnetization M1 of the first ferromagnetic layer 1 and the magnetization M6 of the second ferromagnetic layer 6. Also in the spin-orbit-torque magnetoresistance effect element 20 according to the second embodiment, a spin current can be efficiently generated in the spin-orbit torque wiring 2. Thus, it is possible to reduce a current density required for rotating (reversing) the magnetization M1 of the first ferromagnetic layer 1.

Third Embodiment

<Magnetic Memory>

Figure 4:
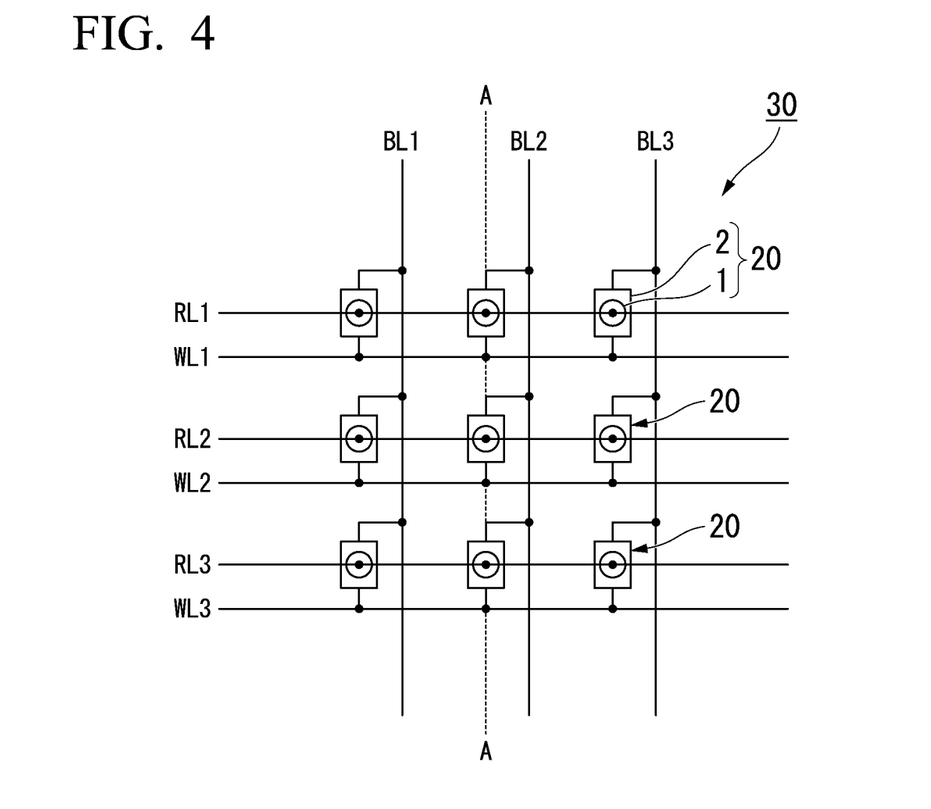
FIG. 4 is a diagram schematically illustrating a magnetic memory according to a third embodiment.

FIG. 4 is a plan view of a magnetic memory 30 which includes a plurality of spin-orbit-torque magnetoresistance effect elements 20 (refer to FIG. 3). FIG. 3 corresponds to a cross-sectional view of one of the spin-orbit-torque magnetoresistance effect elements 20 cut along surface A-A in FIG. 4. In the magnetic memory 30 illustrated in FIG. 4, the spin-orbit-torque magnetoresistance effect element 20 has a 3×3 matrix arrangement. FIG. 4 is an example of a magnetic memory and the number and disposition of the spin-orbit-torque magnetoresistance effect element 20 are arbitrary.

One of word lines WL1 to WL3, one of bit lines BL1 to BL3, and one of read lines RL1 to RL3 are connected to the spin-orbit-torque magnetoresistance effect element 20.

By selecting one of the word lines WL1 to WL3 and one of the bit lines BL1 to BL3 to which a current is applied, the current flows to any spin-orbit torque wiring 2 in the spin-orbit-torque magnetoresistance effect element 20, thereby performing a write operation. Furthermore, by selecting one of the read lines RL1 to RL3 and one of the bit lines BL1 to BL3 to which a current is applied, the current flows in any lamination direction of the spin-orbit-torque magnetoresistance effect element 20, thereby performing a read operation. One of the word lines WL1 to WL3, one of the bit lines BL1 to BL3, and one of the read lines RL1 to RL3 to which a current is applied can be selected using a transistor or the like. That is to say, when data of an arbitrary element is read from the plurality of spin-orbit-torque magnetoresistance effect elements 20, the magnetic memory 30 can be utilized as a magnetic memory.

While the preferred embodiments of the present invention have been described in detail above, the present invention is not limited to the specific embodiments, and various changes and modifications are possible without departing from the gist of the present invention disclosed in the claims.

EXAMPLES

Example 1

An element having a constitution that was the same as that of the spin-orbit-torque magnetoresistance effect element 20 illustrated in FIG. 3 was prepared.

Constituent material of spin-orbit torque wiring 2: $Fe_2TiSn$

Crystal structure of main framework of spin-orbit torque wiring 2: $L2_1$

Cross-sectional area of spin-orbit torque wiring 2: film thickness 5 nm×line width 250 nm Constitution of first ferromagnetic layer 1: CoFe Thickness of first ferromagnetic layer 1: 3 nm Constituent material of non-magnetic layer 5: MgO Thickness of non-magnetic layer 5: 2 nm Constitution of second ferromagnetic layer 6: CoFe Thickness of second ferromagnetic layer 6: 3 nm Shape in a plan view of functional unit: ellipse having short axis of 100 nm×200 nm as first direction It should be noted that, in order to improve the thermal stability, a synthetic structure in which Ru(0.42 nm)/CoFe(3 nm)/IrMn(10 nm) were laminated above the second ferromagnetic layer 6 was provided.

Also, a current density (a reversal current density) required for reversing the magnetization of the first ferromagnetic layer 1 was obtained by applying a current with a pulse width of 5 nsec. As a result, a reversal current density of an element according to Example 1 was $9.2 \times 10^7$ A/cm2.

Example 2

Example 2 and Example 1 differed in that a crystal structure of a main framework of a spin-orbit torque wiring 2 was a B2 structure in Example 2. The crystal structure of the spin-orbit torque wiring 2 can be changed by changing an annealing temperature at the time of preparation. A reversal current density of an element according to Example 2 was $8.4 \times 10^7$ A/cm2.

Example 3

Example 3 and Example 1 differed in that a crystal structure of a main framework of a spin-orbit torque wiring 2 was an A2 structure in Example 3. The crystal structure of the spin-orbit torque wiring 2 can be changed by changing an annealing temperature at the time of preparation. A reversal current density of an element according to Example 3 was $7.6 \times 10^7$ A/cm2.

Example 4

Example 4 and Example 1 differed in that a material constituting a spin-orbit torque wiring 2 was NiZrSn and a crystal structure of a main framework of the spin-orbit torque wiring 2 was a $C1_b$ structure in Example 4. A reversal current density of an element according to Example 4 was $6.9 \times 10^7$ A/cm2.

Example 5

Example 5 and Example 4 differed in that a crystal structure of a main framework of a spin-orbit torque wiring 2 was a B2 structure in Example 5. The crystal structure of the spin-orbit torque wiring 2 can be changed by changing an annealing temperature at the time of preparation. A reversal current density of an element according to Example 5 was $6.0 \times 10^7$ A/cm2.

Example 6

Example 6 and Example 4 differed in that a crystal structure of a main framework of a spin-orbit torque wiring 2 was an A2 structure in Example 6. The crystal structure of the spin-orbit torque wiring 2 can be changed by changing an annealing temperature at the time of preparation. A reversal current density of an element according to Example 6 was $5.2 \times 10^7$ A/cm2.

Comparative Example 1

Comparative Example 1 and Example 1 differed in that a material constituting a spin-orbit torque wiring 2 was made of tungsten in Comparative Example 1. A reversal current density of an element according to Comparative Example 1 was $1.1 \times 10^8$ A/cm2.

The reversal current densities of all of Examples 1 to 3 in which the compounds represented by XYZ were used for the spin-orbit torque wirings and Examples 4 to 6 in which the compounds represented by $X_2YZ$ were used for the spin-orbit torque wirings were reduced as compared with Comparative Example 1. The above results are summarized in Table 1. In Table 1, an SOT wiring refers to a spin-orbit torque wiring.

TABLE 1

| | SOT wiring | Crystal structure | Reversal current density of 5 nsec (A/cm²) |
|---|---|---|---|
| Example 1 | Fe₂TiSn | L2₁ | 9.2 × 10⁷ |
| Example 2 | Fe₂TiSn | B2 | 8.4 × 10⁷ |
| Example 3 | Fe₂TiSn | A2 | 7.6 × 10⁷ |
| Example 4 | NiZrSn | C1ᵦ | 6.9 × 10⁷ |
| Example 5 | NiZrSn | B2 | 6.0 × 10⁷ |
| Example 6 | NiZrSn | A2 | 5.2 × 10⁷ |
| Comparative Example 1 | W | — | 1.1 × 10⁸ |

REFERENCE SIGNS LIST

1 First ferromagnetic layer
2 Spin-orbit torque wiring
5 Non-magnetic layer
6 Second ferromagnetic layer
10 Spin-orbit-torque magnetization rotating element
20 Spin-orbit-torque magnetoresistance effect element
30 Magnetic memory
M1, M7 Magnetization

The invention claimed is:

1. A spin-orbit-torque magnetization rotating element comprising:
a spin-orbit torque wiring extending in a first direction; and
a first ferromagnetic layer laminated on the spin-orbit torque wiring,
wherein the spin-orbit torque wiring includes a compound represented by XYZ or $X_2YZ$ with respect to a stoichiometric composition, and
a main framework of the spin-orbit torque wiring has a structure including any of an $L2_1$ structure, a B2 structure, and an A2 structure in a case where the compound is represented by $X_2YZ$ and
a main framework of the spin-orbit torque wiring has a structure including any of a $C1_b$ structure, the B2 structure, and the A2 structure in a case where the compound is represented by XYZ, and
wherein, in the compound, a value obtained by adding the number of outermost shell electrons of an X element, a Y element, and a Z element is 21 or less in a case where a composition of the compound is represented by XYZ and is 27 or less when the composition of the compound is represented by $X_2YZ$.

2. A spin-orbit-torque magnetization rotating element comprising:
a spin-orbit torque wiring extending in a first direction; and
a first ferromagnetic layer laminated on the spin-orbit torque wiring,
wherein the spin-orbit torque wiring includes a compound represented by XYZ or $X_2YZ$ with respect to a stoichiometric composition, and
a main framework of the spin-orbit torque wiring has a structure including any of an $L2_1$ structure, a B2 structure, and an A2 structure in a case where the compound is represented by $X_2YZ$, and
a main framework of the spin-orbit torque wiring has a structure including any of a $C1_b$ structure, the B2 structure, and the A2 structure in a case where the compound is represented by XYZ, and
wherein the spin-orbit torque wiring is made of a nonmagnetic material or an antiferromagnetic material.

3. The spin-orbit-torque magnetization rotating element according to claim 2, wherein
X is at least one element selected from a group consisting of Fe, Co, Ni, Mn, Re, Ru, Os, Rh, Pd, Jr, and Pt,
Y is at least one element different from the X and selected from a group consisting of Ti, V, Cr, Mo, W, Ta, Mn, Re, Os, Zr, Nb, Hf, Ta, Zn, Cu, Ag, Au, Gd, Tb, Dy, Ho, Er, Fe, Ru, Tm, Yb, and Lu, and
Z is at least one element selected from a group consisting of Al, Si, Ga, Ge, In, Sn, Sb, Pb, Mg, Sr, and Bi.

4. The spin-orbit-torque magnetization rotating element according to claim 1, wherein the main framework of the spin-orbit torque wiring has a structure including any of the B2 structure and the A2 structure in a case where the compound is represented by $X_2YZ$ and
the main framework of the spin-orbit torque wiring has a structure including any of the B2 structure and the A2 structure in a case where the compound is represented by XYZ 5. The spin-orbit-torque magnetization rotating element according to claim 2, wherein, in the compound, a value obtained by adding the number of outermost shell electrons of an X element, a Y element, and a Z element
is 21 or less in a case where a composition of the compound is represented by XYZ and
is 27 or less when the composition of the compound is represented by $X_2YZ$.

6. The spin-orbit-torque magnetization rotating element according to claim 1, wherein the spin-orbit torque wiring is made of an antiferromagnetic material.

7. The spin-orbit-torque magnetization rotating element according to claim 1, wherein the X element, the Y element, or the Z element in the compound includes an element of the fifth period or higher in the periodic table.

8. The spin-orbit-torque magnetization rotating element according to claim 1, wherein the compound is represented by XYZ in the stoichiometric composition.

9. The spin-orbit-torque magnetization rotating element according to claim 1, wherein the first ferromagnetic layer includes a ferromagnetic material represented by XYZ or $X_2YZ$ in the stoichiometric composition,
X is at least one element selected from a group consisting of Fe, Co, Ni, Cu, Zn, Ru, Rh, Pd, Ag, Cd, Ir, Pt, and Au,
Y is at least one element selected from a group consisting of Ti, V, Cr, Mn, Y, Zr, Nb, Hf, Ta, Gd, Tb, Dy, Ho, Er, Fe, Tm, Yb, and Lu, and
Z is at least one element selected from a group consisting of Al, Si, Ga, Ge, As, In, Sn, Sb, Tl, Pb, and Bi.

10. The spin-orbit-torque magnetization rotating element according to claim 9, wherein the first ferromagnetic layer includes a ferromagnetic material represented by $Co_2YZ$ in the stoichiometric composition,
Y is at least one of Mn and Fe, and
Z is at least one element selected from a group consisting of Al, Si, Ga, and Ge.

11. A spin-orbit-torque magnetoresistance effect element comprising:
the spin-orbit-torque magnetization rotating element according to claim 1;
a second ferromagnetic layer facing the first ferromagnetic layer at a position on the first ferromagnetic layer opposite to the spin-orbit torque wiring; and
a non-magnetic layer sandwiched between the first ferromagnetic layer and the second ferromagnetic layer.

12. A magnetic memory, comprising:
a plurality of the spin-orbit-torque magnetoresistance effect elements according to claim 11.

13. The spin-orbit-torque magnetization rotating element according to claim 1, wherein
X is at least one element selected from a group consisting of Fe, Co, Ni, Mn, Re, Ru, Os, Rh, Pd, Ir, and Pt,
Y is at least one element different from the X and selected from a group consisting of Ti, V, Cr, Mo, W, Ta, Mn, Re, Os, Zr, Nb, Hf, Ta, Zn, Cu, Ag, Au, Gd, Tb, Dy, Ho, Er, Fe, Ru, Tm, Yb, and Lu, and Z is at least one element selected from a group consisting of Al, Si, Ga, Ge, In, Sn, Sb, Pb, Mg, Sr, and Bi.

14. The spin-orbit-torque magnetization rotating element according to claim 2, wherein the main framework of the spin-orbit torque wiring has a structure including any of the B2 structure and the A2 structure in a case where the compound is represented by $X_2YZ$ and
the main framework of the spin-orbit torque wiring has a structure including any of the B2 structure and the A2 structure in a case where the compound is represented by XYZ.

15. The spin-orbit-torque magnetization rotating element according to claim 2, wherein the spin-orbit torque wiring is made of an antiferromagnetic material.

16. The spin-orbit-torque magnetization rotating element according to claim 2, wherein the X element, the Y element, or the Z element in the compound includes an element of the fifth period or higher in the periodic table.

17. The spin-orbit-torque magnetization rotating element according to claim 2, wherein the compound is represented by XYZ in the stoichiometric composition.

18. The spin-orbit-torque magnetization rotating element according to claim 2, wherein the first ferromagnetic layer includes a ferromagnetic material represented by XYZ or $X_2YZ$ in the stoichiometric composition,
X is at least one element selected from a group consisting of Fe, Co, Ni, Cu, Zn, Ru, Rh, Pd, Ag, Cd, Ir, Pt, and Au,
Y is at least one element selected from a group consisting of Ti, V, Cr, Mn, Y, Zr, Nb, Hf, Ta, Gd, Tb, Dy, Ho, Er, Fe, Tm, Yb, and Lu, and
Z is at least one element selected from a group consisting of Al, Si, Ga, Ge, As, In, Sn, Sb, Tl, Pb, and Bi.

19. The spin-orbit-torque magnetization rotating element according to claim 18, wherein the first ferromagnetic layer includes a ferromagnetic material represented by $Co_2YZ$ in the stoichiometric composition,
Y is at least one of Mn and Fe, and
Z is at least one element selected from a group consisting of Al, Si, Ga, and Ge.

20. A spin-orbit-torque magnetoresistance effect element comprising:
the spin-orbit-torque magnetization rotating element according to claim 2;
a second ferromagnetic layer facing the first ferromagnetic layer at a position on the first ferromagnetic layer opposite to the spin-orbit torque wiring; and
a non-magnetic layer sandwiched between the first ferromagnetic layer and the second ferromagnetic layer.

21. A magnetic memory, comprising:
a plurality of the spin-orbit-torque magnetoresistance effect elements according to claim 20.

* * * * *